(12) United States Patent
Chen et al.

(10) Patent No.: US 7,179,542 B2
(45) Date of Patent: Feb. 20, 2007

(54) THIAZOLE- AND IMIDAZOLE-FUSED PHENANTHROLINE MOLECULES IN ORGANIC LIGHT-EMITTING DEVICES

(75) Inventors: Jian Ping Chen, Palo Alto, CA (US); Koichi Suzuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 271 days.

(21) Appl. No.: 10/441,164

(22) Filed: May 20, 2003

(65) Prior Publication Data

US 2004/0234809 A1 Nov. 25, 2004

(51) Int. Cl.
*H05B 33/12* (2006.01)

(52) U.S. Cl. ............... 428/690; 428/917; 313/504; 313/506

(58) Field of Classification Search ........... 428/690, 428/917; 252/301.16, 301.32, 301.24, 301.26; 313/504, 506; 257/40
See application file for complete search history.

(56) References Cited

U.S. PATENT DOCUMENTS

| | | | |
|---|---|---|---|
| 4,772,563 A | 9/1988 | Evangelista et al. | 436/518 |
| 5,006,503 A | 4/1991 | Byers et al. | 503/227 |
| 5,281,489 A * | 1/1994 | Mori et al. | 428/690 |
| 5,294,869 A | 3/1994 | Tang et al. | 313/504 |
| 5,393,614 A | 2/1995 | Nakada | 428/690 |
| 5,578,498 A | 11/1996 | Singh et al. | 436/518 |
| 5,645,948 A | 7/1997 | Shi et al. | 428/690 |
| 5,755,999 A | 5/1998 | Shi et al. | 252/301.16 |
| 6,010,796 A | 1/2000 | Kijima | 428/690 |
| 6,713,781 B1 * | 3/2004 | Chen et al. | 257/40 |
| 2001/0006742 A1 | 7/2001 | Morioka et al. | 428/690 |
| 2003/0168970 A1 * | 9/2003 | Tominaga et al. | 313/504 |
| 2004/0209117 A1 * | 10/2004 | Aziz et al. | 428/690 |

FOREIGN PATENT DOCUMENTS

| | | |
|---|---|---|
| JP | 5-331459 | 12/1993 |
| JP | 2001-267080 | 9/2001 |
| WO | 00/70655 | 11/2000 |

OTHER PUBLICATIONS

Bian et al., "A Novel Ternary Complex of Europium (II) for Electroluminescent device". 2002, Chemical Research in Chinese Universities, 18(4) pp. 466-468.*

"Superradiant properties of 4,4'-bis(1*H*-phenanthro[9,10-*d*]imidazol-2-yl)biphenyl and how a laser dye with exceptional stability can be obtained in only one synthetic step", Krebs, et al., Tetrahedron Letters 42 (2001), pp. 6753-6757.

"Synthesis and Study of a Mixed-ligand Ruthenium(ii) Complex in Its Ground and Excited States: Bis(2,2'-bipyridine)(dipyrido[3,2-*a*:2',3'-*c*]phenazine-$N^4N^5$)ruthenium(ii)" E. Amouyal, et al., Journal Of The Chemical Society, Dalton Transactions 5 (1990), pp. 1841-1845.

"Recent Developments In Molecular Organic Electroluminescent Materials," C.H. Chen, et al., Macromolecular Symposia 125 (1998), pp. 1-48.

* cited by examiner

*Primary Examiner*—Rena Dye
*Assistant Examiner*—Camie S. Thompson
(74) *Attorney, Agent, or Firm*—Fitzpatrick, Cella, Harper & Scinto

(57) ABSTRACT

An organic light-emitting device (OLED) in which an oxazole-, thiazole-, or imidazole-fused phenanthroline molecule is used in an emissive layer, a charge transport layer, and/or a charge blocking layer.

34 Claims, 1 Drawing Sheet

THIAZOLE- AND IMIDAZOLE-FUSED PHENANTHROLINE MOLECULES IN ORGANIC LIGHT-EMITTING DEVICES

BACKGROUND OF THE INVENTION

1. Field of the Invention

The present invention relates to an organic light emitting device (OLED) in which an oxazole-, thiazole-, or imidazole-fused phenanthroline molecule is used in an emissive layer, a charge transport layer, and/or a charge blocking layer.

2. Description of the Related Art

OLEDs are commercially attractive for various display applications due to their high efficiency, low driving voltage, wide color range, light weight, simple device fabrication and potential low cost. Great efforts have been made to develop effective materials for use in these devices.

OLEDs typically comprise an emissive layer sandwiched between a transparent anode, such as transparent indium tin oxide (ITO), and a metal cathode, such as Mg, Al, Ag or their alloys. When a bias is applied across the electrodes, positive charges (holes) and negative charges (electrons) are respectively injected from the anode and cathode into the emissive layer. The holes and the electrons radiatively combine in the emissive layer and emit light.

To improve the power efficiency of an OLED, it is frequently desirable to enhance charge injection at the electrode interface. Hole transport layers and electron transport layers may be added adjacent the respective electrodes to facilitate charge transfer. In some instances, the emissive layer is located within the hole transport or electron transport layer.

Improved performance can be obtained if blocking layers are provided to block against the injection of either holes or electrons from the adjoining layer and their subsequent escape from the device.

A layer may have combined functionalities. For example, an electron transport layer may also function as a hole blocking layer.

In addition, it is possible to form the various layers from a host material doped with another material designed to achieve the desired effect of the layer (for example, to achieve a charge transport effect, a charge blocking effect, or an emissive effect).

In an electro-luminescent OLED, the luminescence observed is fluorescent. Fluorescence is understood to mean luminescent emission occurring only during the period during which an excitation (such as driving voltage) is applied, and is created mostly, if not exclusively, by relaxation from the singlet state.

In an electro-phosphorescent OLED, in which a phosphorescent dye is utilized, both singlet state relaxation and triplet state relaxation contribute to emission, and emission persists after the period of excitation.

Because of consumer expectations of good efficiency, long lifetime and pure color for OLEDs, a need exists for the development of effective materials for use in these devices.

SUMMARY OF THE INVENTION

It is an object of the invention to provide an improved OLED by including an oxazole-, thiazole-, or imidazole-fused phenanthroline molecule in a functional layer (i.e., an emissive layer, an electron transport layer, a hole transport layer, an electron blocking layer, a hole blocking layer, or a layer combining one or more of these properties) of the OLED.

Thus, in one aspect, the invention is an OLED in which a functional layer is sandwiched between an anode and a cathode, and in which the functional layer includes an oxazole-, thiazole-, or imidazole-fused phenanthroline molecule.

In a more detailed aspect of the invention of the invention, the oxazole-, thiazole-, or imidazole-fused phenanthroline molecule is a 1,10-phenanthroline molecule having the following structure:

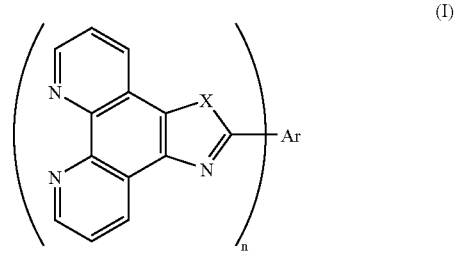

(I)

where X is O, S, or NR (with R being H, an alkyl group, or an aromatic group), n is a number 1 to 10, and Ar is an aromatic group.

In another more detailed aspect of the invention, the oxazole-, thiazole-, or imidazole-fused phenanthroline molecule is a 1,7-phenanthroline molecule having the following structure:

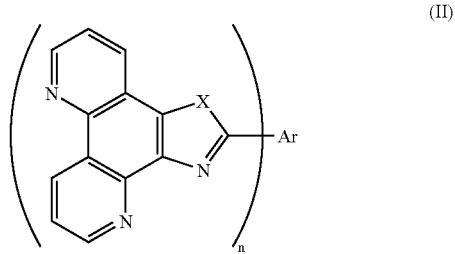

(II)

where X is O, S, or NR (with R being H, an alkyl group, or an aromatic group), n is a number 1 to 10, and Ar is an aromatic group.

In yet another more detailed aspect of the invention, the oxazole-, thiazole-, or imidazole-fused phenanthroline molecule is a 4,7-phenanthroline molecule having the following structure:

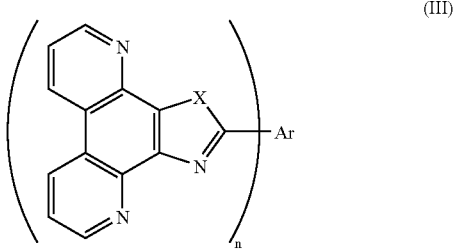

(III)

where X is O, S, or NR (with R being H, an alkyl group, or an aromatic group), n is a number 1 to 10, and Ar is an aromatic group.

Some preferred imidazole-fused 1,10-phenanthrolines are listed below:
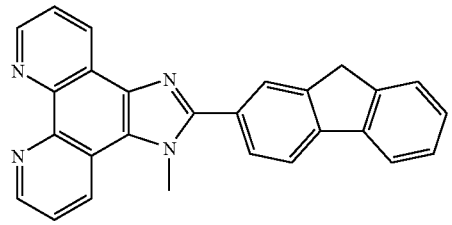
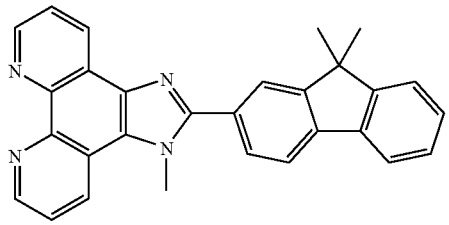
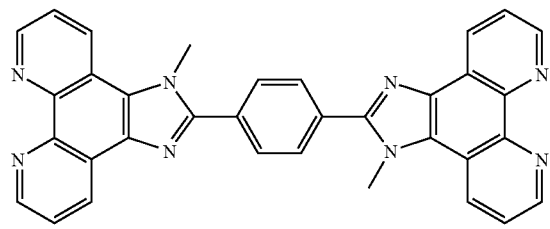
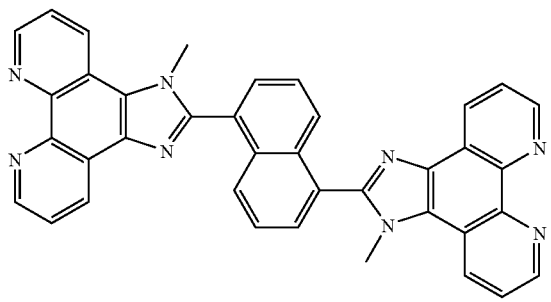
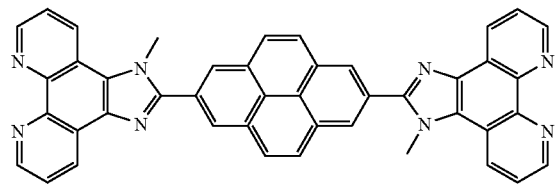
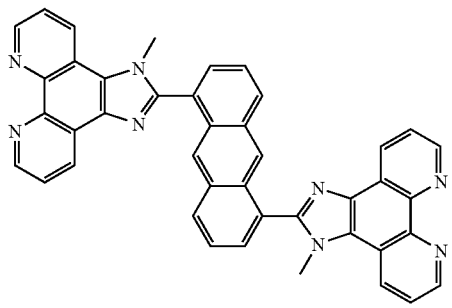
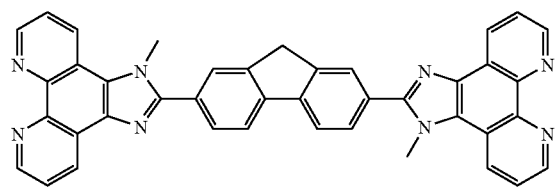
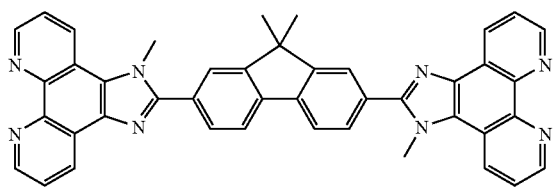
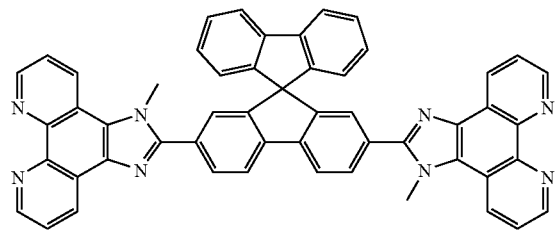
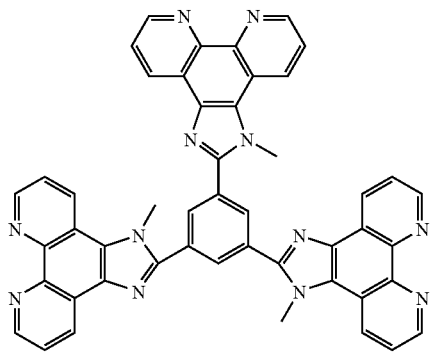

-continued

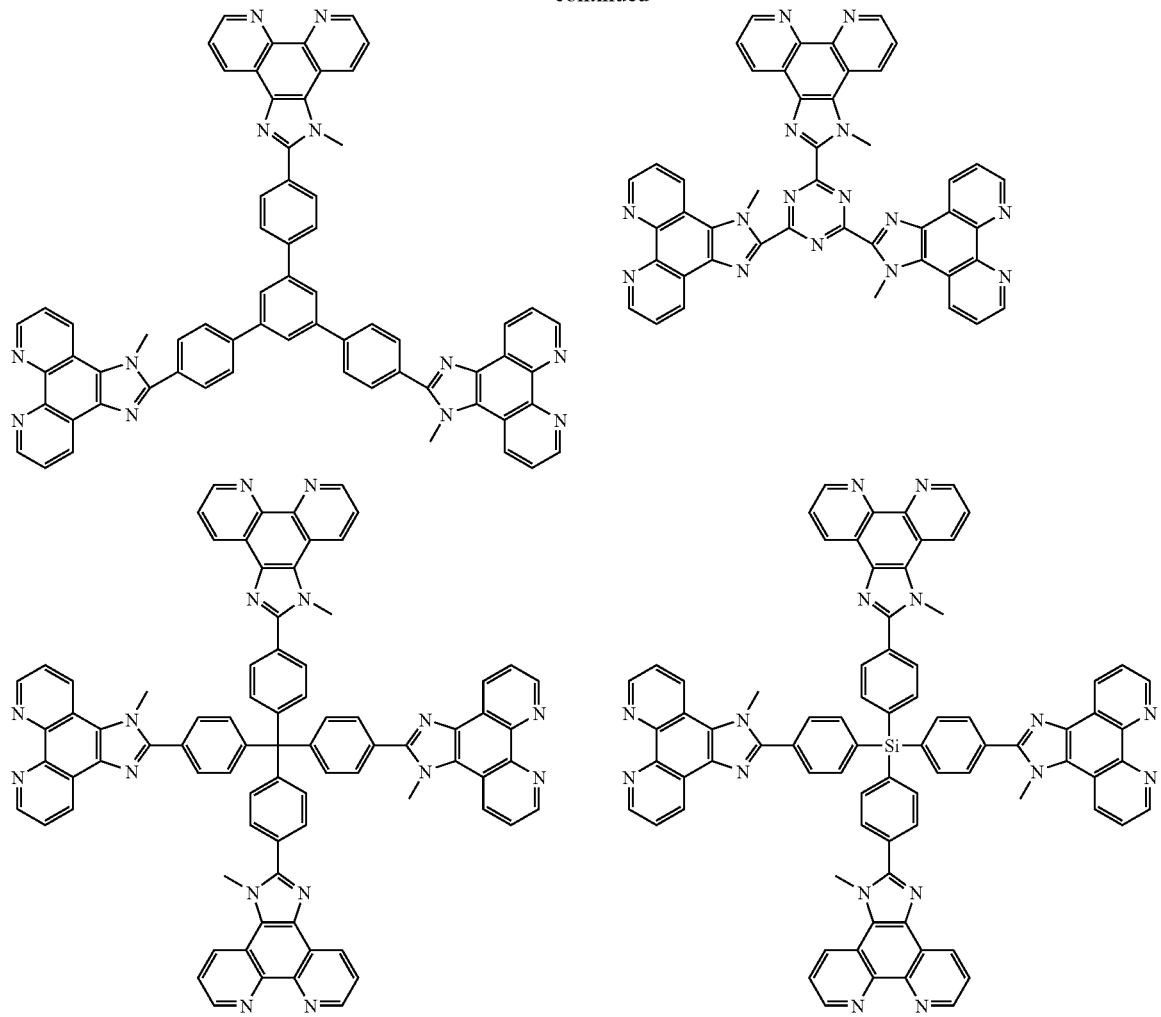

In the above-listed structures, 1,7-phenanthroline or 4,7-phenanthroline may be substituted for 1,10-phenanthroline, and any NR (with R being H, an alkyl group, or an aromatic group) may be substituted for N—CH$_3$. In addition, oxazole or thiazole may be substituted for imidazole.

The oxazole-, thiazole-, or imidazole-fused phenanthroline molecule may be deposited neat or doped into a host material in a guest-host system. In addition, the oxazole, thiazole-, or imidazole-fused phenanthroline may be used as a host for a functional guest material in a guest-host system.

Preferably, the oxazole-, thiazole-, or imidazole-fused phenanthroline molecule is used in an electron transport layer and/or a hole blocking layer.

The oxazole-, thiazole-, or imidazole-fused phenanthroline molecule may be used in both electro-luminescent and electro-phosphorescent OLEDs.

This brief summary has been provided so that the nature of the invention may be understood quickly. A more complete understanding of the invention can be obtained by reference to the following detailed description of the preferred embodiments thereof in connection with the attached drawing.

DETAILED DESCRIPTION OF THE INVENTION

Figure 1:
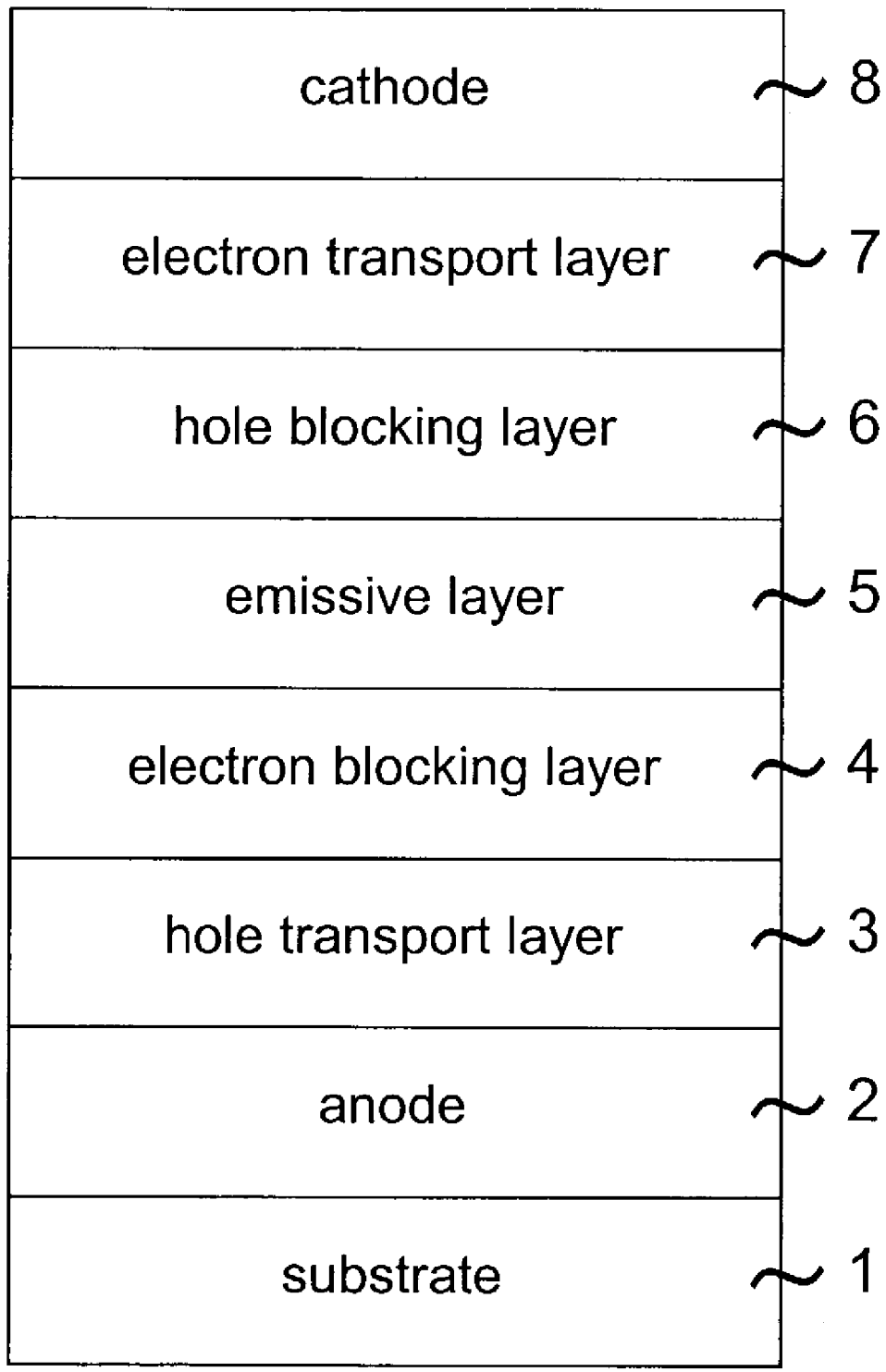
FIG. 1 is a schematic cross-sectional view of an OLED according to the invention.

The present invention provides for the utilization of an oxazole-, thiazole-, or imidazole-fused phenanthroline molecule in a functional layer of an OLED. Oxazole-, thiazole-, or imidazole-fused phenanthroline may exhibit excellent emitting, charge transporting, and/or charge blocking abilities. In addition, an oxazole-, thiazole-, or imidazole-fused phenanthroline acting as a host material for a functional material may lead to increased performance for an OLED.

FIG. 1 schematically depicts an OLED according to the invention, including substrate 1, anode 2, hole transport layer 3, electron blocking layer 4, emissive layer 5, hole blocking layer 6, electron transport layer 7, and cathode 8. Each of these layers may itself comprise multiple layers. Functional layers may also be combined. For example, an emissive layer may be adapted to exhibit electron transport properties, or an electron transport layer may be adapted to exhibit hole blocking properties. The layers 3, 4, 6 and 7 are optional.

Suitable materials for substrate 1 include glass, quartz and the like, and polymers (including, without limitation, polyesters, polycarbonates, polyacrylates, polymethacrylates, and polysulfones). The thickness of the substrate is not critical and can range, for example, from about 25 to over 1,000 microns, depending on the structural demands of the device. The substrate is preferably transparent.

The anode 2 adjacent the substrate can be comprised of a metal, an alloy, an electroconducting compound, or mixtures thereof, with a work function preferably equal to or greater than about 4.0 electron volts. Specific examples of anodes include hole injecting electrodes such as indium tin oxide (ITO), tin oxide, zinc oxide, gold, platinum, electrically conductive carbon, and conjugated polymers such as polyaniline, polypyrrole, and the like. ITO is preferred, as it has good transparency to visible light. The thickness of the anode can range anywhere from about 10 nanometers to 1 micron or more The anode may be deposited by sputtering, or other method of thin film deposition known in the art, preferably thermal evaporative deposition under high vacuum.

The hole transport layer 3 may be comprised of any material which can inject and transport holes into the emissive layer. Preferably, the thickness of the hole transporting layer is in the range of 10 Angstroms to 1000 Angstroms or more. One suitable hole transport material is 1,4-bis[(1-naphthyphenyl)-amino]biphenyl (NPD), shown below.

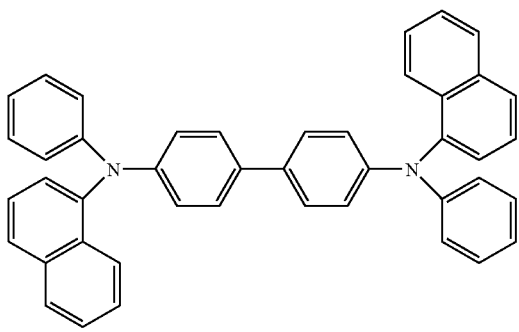

1,4-bis[(1-naphthyphenyl)-amino]biphenyl (NPD)

The electron blocking layer 4 may be comprised of any material described in that art as suitable for blocking against the passage of electrons and their subsequent escape from the device.

The emissive layer 5 may be comprised of materials described in the art as suitable for this purpose, including without limitation the materials described in B. R. Hsieh, Ed., "Organic Light-Emitting Materials and Devices," *Macromolecular Symposia*, Vol. 125, pp. 1–48 (January, 1998) and U.S. Pat. No. 5,294,869, which are herein incorporated by reference. However, the invention is not limited to the use of these materials. Preferably, the thickness of the emissive layer 4 ranges from 10 Angstroms to 1000 Angstroms or more. One suitable emissive material which may be used in the present invention is aluminum tris(8-hydroxyquinoline) (AlQ$_3$), shown below.

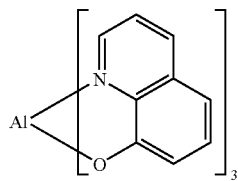

AlQ$_3$ (aluminum tris(8-hydroxyquinoline))

The hole blocking layer 6 may be comprised of any material described in the art as suitable for blocking against the passage of holes and their subsequent escape from the device. Typically, a hole blocking material has a large ionization potential which allows it to block the passage of holes. One material suitable for this purpose is 2,9-dimethyl-4,7 dipphenyl-1,10-phenanthroline (bathocuproine, BCP).

Suitable materials for the electron transport layer 7 include metal chelates, such as AlQ$_3$, BeBq$_2$, 1,3,4-oxiazole derivatives (OXDs) such as PBD, and 1,2,4-triazoles (TAZs). However, the invention is not limited to the use of these materials.

The cathode 8 may be comprised of any metal, including high or low work function metals. Aluminum, lithium, magnesium, and calcium are particularly preferred. At least one of the anode 2 and the cathode 8 must be transparent to produce a functioning OLED.

In a generalized procedure for fabricating an OLED, a clean substrate 1 having an anode 2 patterned thereon is treated with O$_2$ for 1 to 5 minutes. Then, the substrate having the anode layer 2 patterned thereon is placed in a thermal evaporator and the pressure is reduced to below 6×10$^{-6}$ torr. The various layers 3 to 8 are formed by thermal evaporation. A mask is placed over the electron transport layer 8 so that the anode 9 can be formed in a pattern. The anode 9 is deposited, after which the thermal evaporator is allowed to cool.

EXAMPLE 1

1,10-phenanthroline-5,5-dione (0.525 g., 2.5 mmol), aluminum acetate (2 g), 2-fluorenecarboxaldehyde (0.485 g., 2.5 mmol), and 25 mL of acetic acid were added to a round flask. (1,10-phenanthroline-5,5-dione was synthesized according to the procedures in Journal of Chemical Society, Dalton Trans. (1990), pp. 1841 to 1845.) The mixture was heated at 120° C. under N$_2$ for two hours. After cooling down, the mixture was poured into an open beaker, and the solvent was air-evaporated for a few days. The remaining wet solids were filtrated and washed with water. The product was purified by recrystallization from methanol to obtain a 70% yield of compound A, shown below. The synthesization of compound A may be represented as follows:

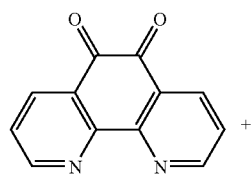

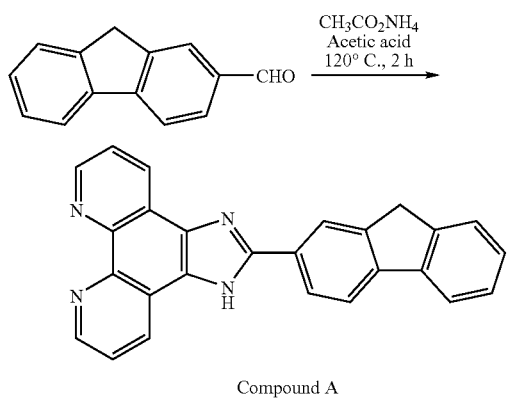

Compound A

Compound A may be fabricated into an OLED using the generalized procedure discussed above.

EXAMPLE 2

Compound A (0.76 g., 1.98 mmol) and NaOt-Bu (0.68 g., 7.1 mmol) were added to a round flask. The flask was evacuated and purged with nitrogen, alternately, for two cycles. Under nitrogen, 20 mL of anhydrous DMF was added and the solution was stirred at room temperature for 10 minutes, and then cooled to 0° C. To this was added iodomethane (3.55 mL, 7.1 mmol, 2 M in ether). The mixture was stirred at 0° C. to room temperature for 2 hours, and poured into water. The precipitate was filtrated and washed with water, and purified by recrystallization from methanol to obtain a 50% yield of compound B, shown below. The synthesization of compound B may be represented as follows:

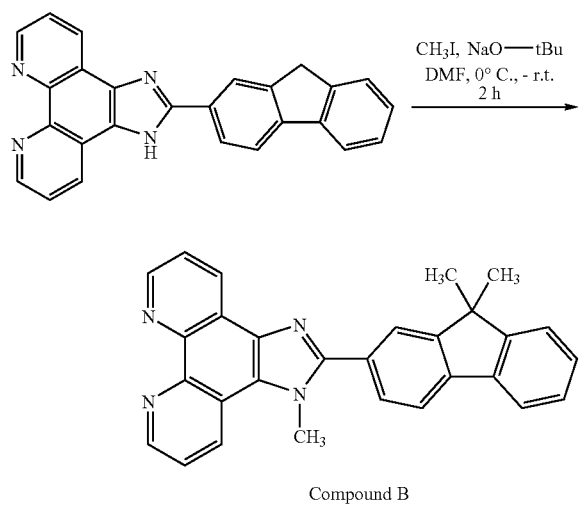

Compound B

A TGA scan of compound B indicated a thermal decomposition temperature of 390° C. Compound B is blue emissive in THF solution and green-yellow emissive in the solid. Compound B may be fabricated into an OLED using the generalized procedure discussed above.

EXAMPLE 3

Compound C, shown below, was synthesized using the same procedure as described in Example 1, except that terephaldicarboxaldehyde replaced 2-fluorenecarboxaldehyde, and the molar ratio of 1,10-phenanthroline-5,5-dione to terephaldicarboxaldehyde was 2:1. The synthesization of Compound C may be represented as follows:

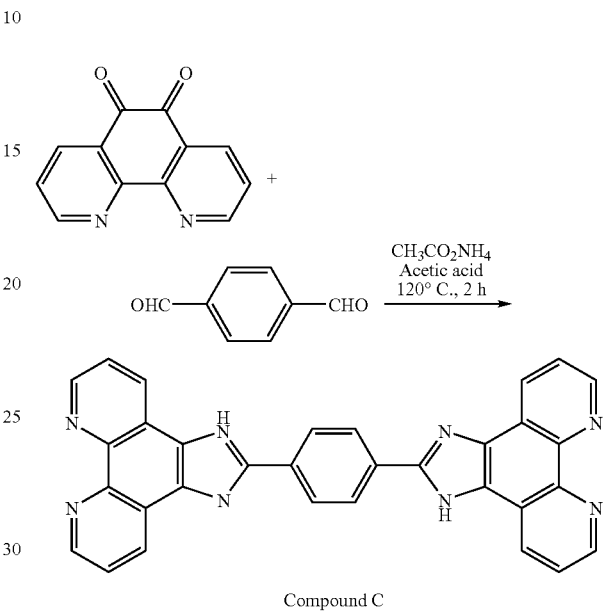

Compound C

Compound C may be fabricated into an OLED using the generalized procedure discussed above.

EXAMPLE 4

Compound D, shown below, was synthesized using the same procedure as described in Example 2, except that compound A was replaced with compound C as the starting material. The synthesization of compound D can be represented as follows:

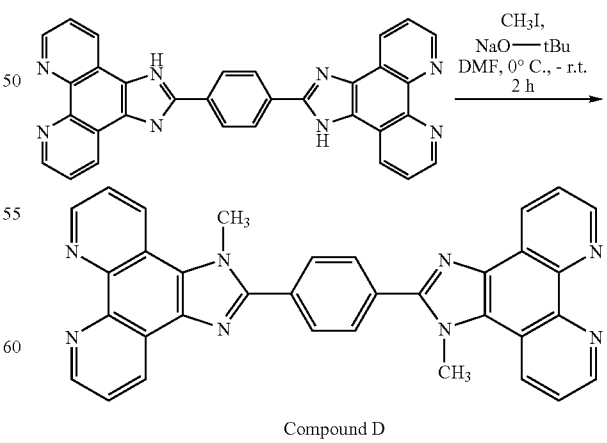

Compound D

Compound D may be fabricated into an OLED using the generalized procedure mentioned above.

EXAMPLE 5

An indium tin oxide (ITO) anode material was patterned on a glass substrate (with an area of 0.0314 cm² of ITO). A layer of NPD was vacuum deposited as a hole transport layer to a thickness of 40 nm. A layer of AlQ₃ was vacuum deposited as an emissive layer to a thickness of 30 nm. Compound 2, shown above, was vacuum deposited as an electron transport and/or hole blocking layer at a thickness of 20 nm. Finally, a bilayer cathode was applied comprising a layer of Li—Al (1:9, 12 nm) followed by a layer of Al (150 nm). Upon application of a forward bias, a green luminescent emission was observed, peaking at 520 nm.

EXAMPLE 6

An indium tin oxide (ITO) anode material was patterned on a glass substrate (with an area of 0.0314 cm² of ITO). A layer of NPD was vacuum deposited as a hole transport layer to a thickness of 40 nm. A layer of AlQ₃ was vacuum deposited as an emissive layer to a thickness of 30 nm. Compound 4, shown above, was vacuum deposited as an electron transport and/or hole blocking layer to a thickness of 20 nm. Finally, a bilayer cathode was deposited, comprising a layer of Li—Al (1:9, 12 nm) followed by a layer of Al (150 nm). Upon application of a forward bias, a green luminescent emission was observed, peaking at 520 nm.

The foregoing examples are for illustration purposes and are not to be considered limiting of the invention, which is defined by the following claims.

What is claimed is:

1. An organic light-emitting device comprising an anode, a cathode, and at least one functional layer sandwiched between the anode and the cathode, said functional layer comprising a phenanthroline molecule having the following structure:

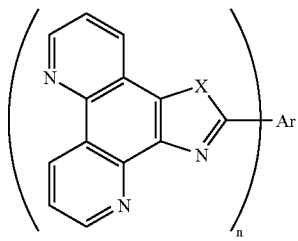

wherein X is S or NR, with R being H, an alkyl group, or an aromatic group; n is a number from 1 to 10; and Ar is an aromatic group.

2. The organic light-emitting device according to claim 1, wherein said phenanthroline molecule has the formula:

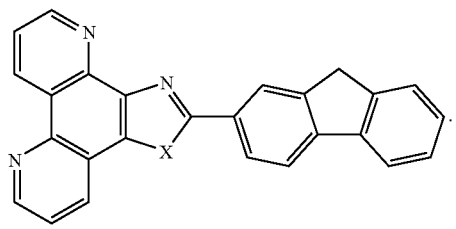

3. The organic light-emitting device according to claim 1, wherein said phenanthroline molecule has the formula:

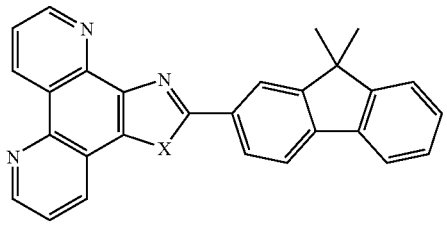

4. The organic light-emitting device according to claim 1, wherein said phenanthroline molecule has the formula:

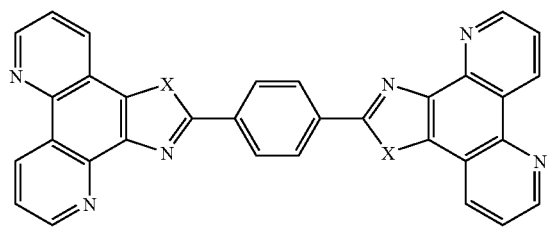

5. The organic light-emitting device according to claim 1, wherein said phenanthroline molecule has the formula:

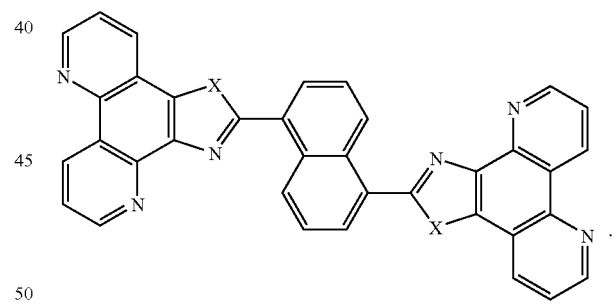

6. The organic light-emitting device according to claim 1, wherein said phenanthroline molecule has the formula:

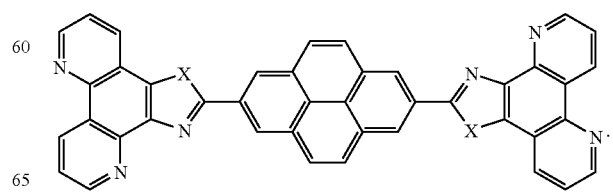

7. The organic light-emitting device according to claim 1, wherein said phenanthroline molecule has the formula:

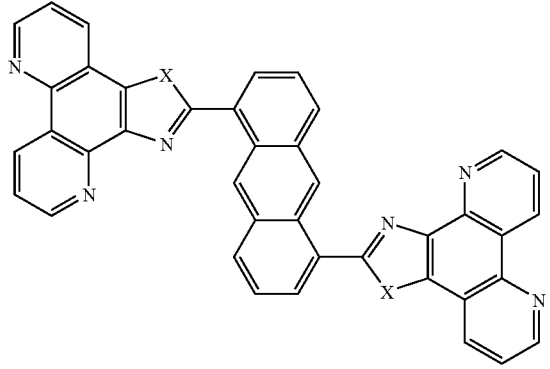

8. The organic light-emitting device according to claim 1, wherein said phenanthroline molecule has the formula:

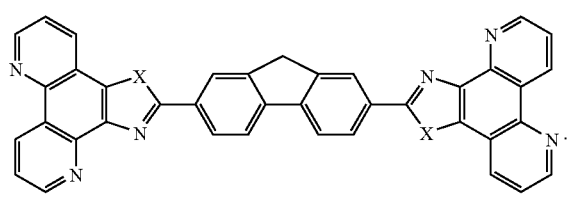

9. The organic light-emitting device according to claim 1, wherein said phenanthroline molecule has the formula:

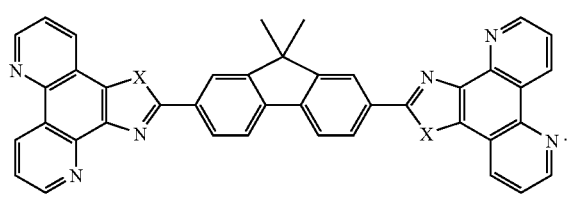

10. The organic light-emitting device according to claim 1, wherein said phenanthroline molecule has the formula:

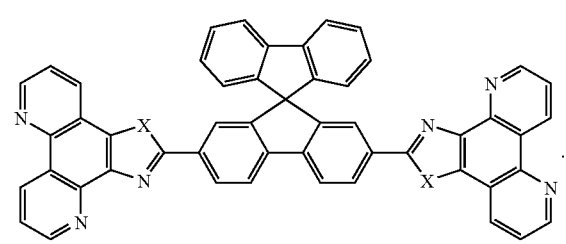

11. The organic light-emitting device according to claim 1, wherein said phenanthroline molecule has the formula:

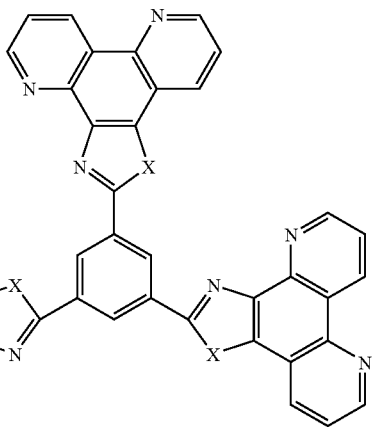

12. The organic light-emitting device according to claim 1, wherein said phenanthroline molecule has the formula:

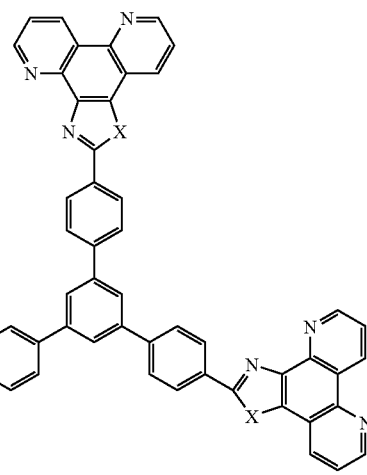

13. The organic light-emitting device according to claim 1, wherein said phenanthroline molecule has the formula:

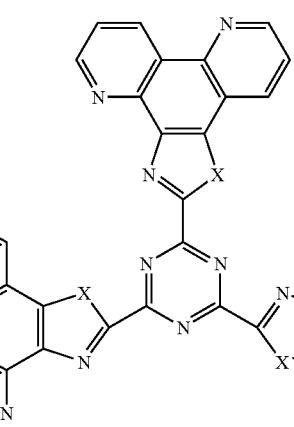

14. The organic light-emitting device according to claim 1, wherein said phenanthroline molecule has the formula:

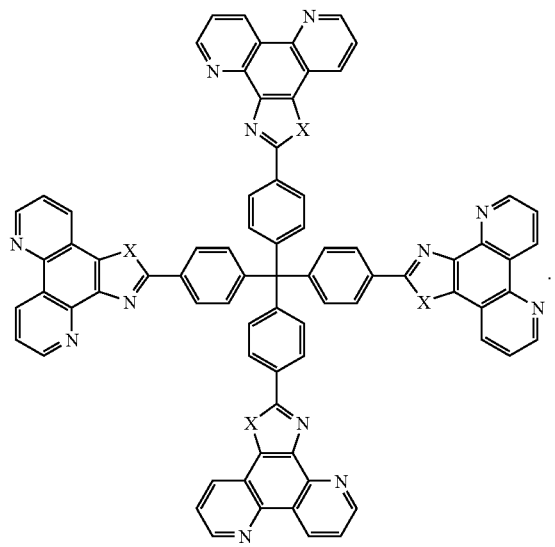

15. The organic light-emitting device according to claim 1, wherein said phenanthroline molecules has the formula:

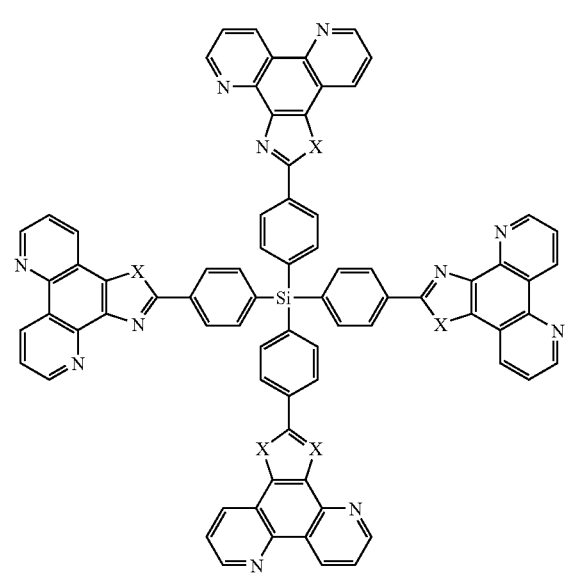

16. An organic light-emitting device comprising an anode, a cathode, and at least one functional layer sandwiched between the anode and the cathode, said functional layer comprising a phenanthroline molecule having the following structure:

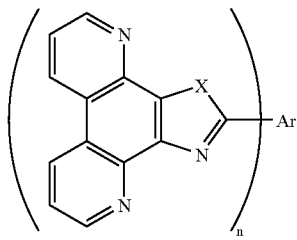

wherein X is S or NR, with R being H, an alkyl group, or an aromatic group; n is a number from 1 to 10; and Ar is an aromatic group.

17. The organic light-emmitting device according to claim 16, wherein said phenanthroline molecule has the formula:

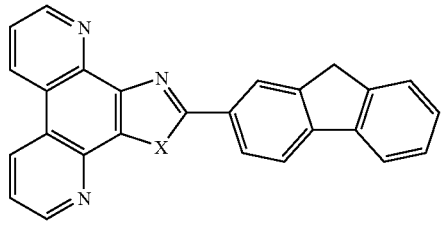

18. The organic light-emitting device according to claim 16, wherein said phenanthroline molecule has the formula:

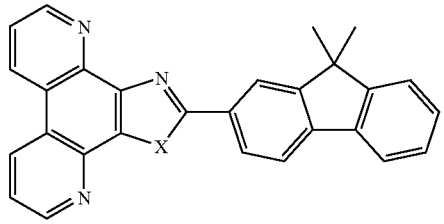

19. The organic light-emitting device according to claim 16, wherein said phenanthroline molecule has the formula:

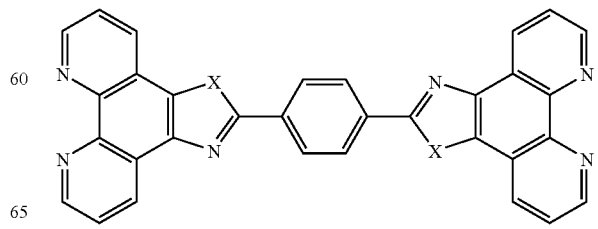

20. The organic light-emitting device according to claim 16, wherein said phenanthroline molecule has the formula:

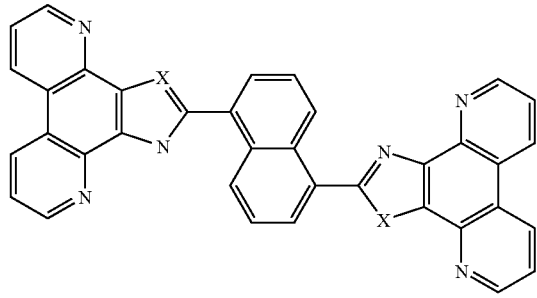

21. The organic light-emitting device according to claim 16, wherein said phenanthroline molecule has the formula:

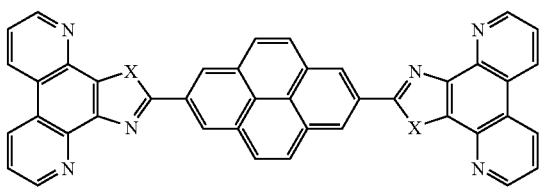

22. The organic light-emitting device according to claim 16, wherein said phenanthroline molecule has the formula:

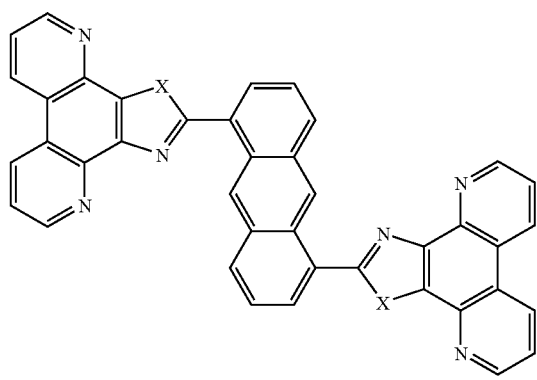

23. The organic light-emitting device according to claim 16, wherein said phenanthroline molecule has the formula:

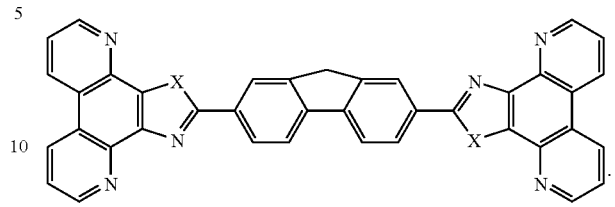

24. The organic light-emitting device according to claim 16, wherein said phenanthroline molecule has the formula:

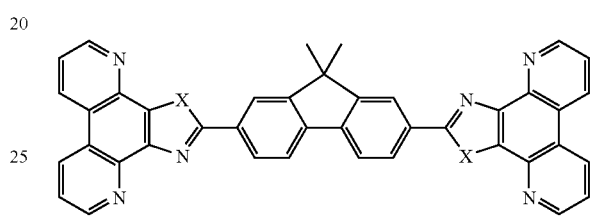

25. The organic light-emitting device according to claim 16, wherein said phenanthroline molecule has the formula:

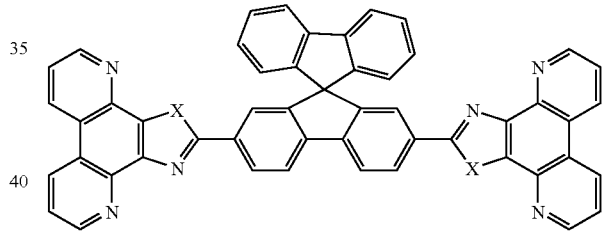

26. The organic light-emitting device according to claim 16, wherein said phenanthroline molecule has the formula:

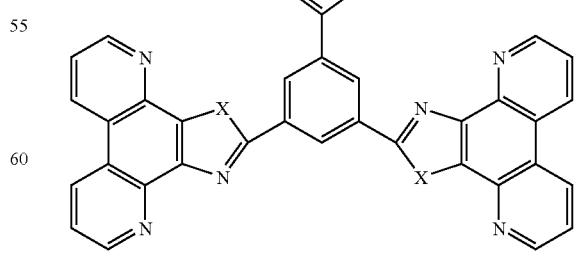

27. The organic light-emitting device according to claim 16, wherein said phenanthroline molecule has the formula:

28. The organic light-emitting device according to claim 16, wherein said phenanthroline molecule has the formula:

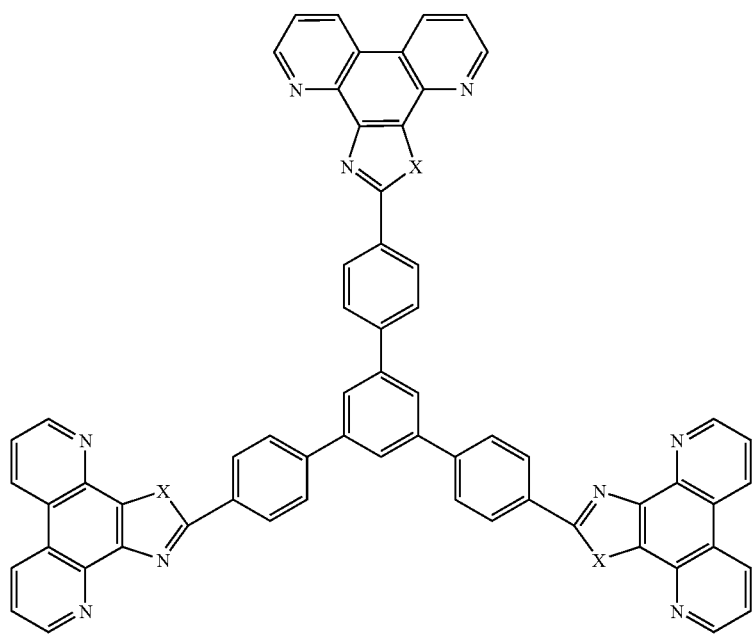

29. The organic light-emitting device according to claim 16, wherein said phenanthroline molecule has the formula:

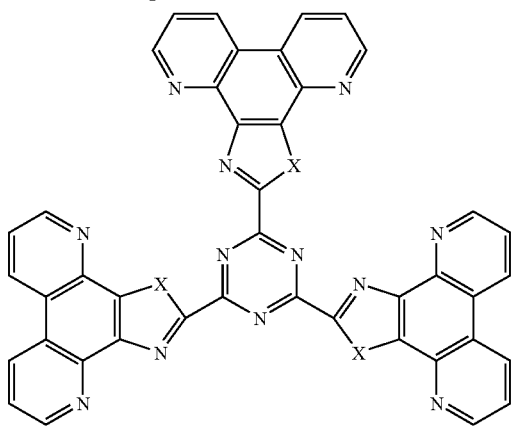

30. The organic light-emitting device according to claim 16, wherein said phenanthroline molecule has the formula:

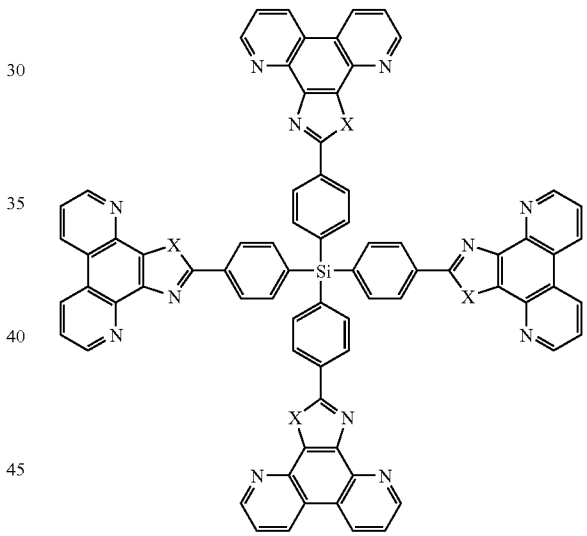

31. The organic light-emitting device according to claim 1, wherein said functional layer is sandwiched together with an emissive layer, and wherein said functional layer is at least one of an electron transport layer and a hole blocking layer.

32. The organic light-emitting device according to claim 1, wherein said functional layer is a guest-host system including a functional guest material and a host material comprising said phenanthroline molecule.

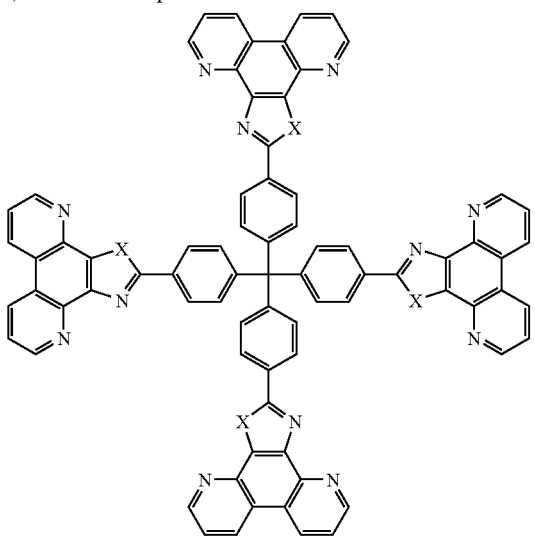

33. The organic light-emitting device according to claim 16, wherein said functional layer is sandwiched together with an emissive layer, and wherein said functional layer is at least one of an electron transport layer and a hole blocking layer.

34. The organic light-emitting device according to claim 16, wherein said functional layer is a guest-host system including a functional guest material and a host material comprising said phenanthroline molecule.

* * * * *

UNITED STATES PATENT AND TRADEMARK OFFICE
CERTIFICATE OF CORRECTION

PATENT NO. : 7,179,542 B2 Page 1 of 5
APPLICATION NO. : 10/441164
DATED : February 20, 2007
INVENTOR(S) : Jian Ping Chen et al.

It is certified that error appears in the above-identified patent and that said Letters Patent is hereby corrected as shown below:

COLUMN 2
Line 9, the first occurrence of "of the invention" should be deleted.

COLUMN 7
Line 22, "more" should be --more.--.

COLUMN 10
Lines 46-63, "

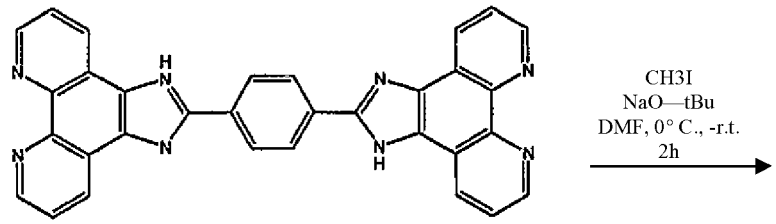

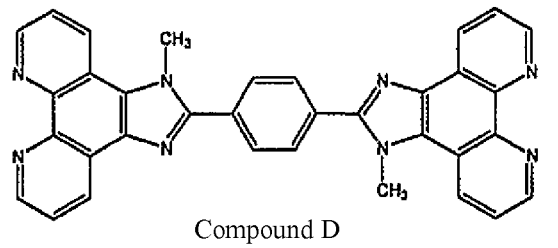

Compound D

"

should read

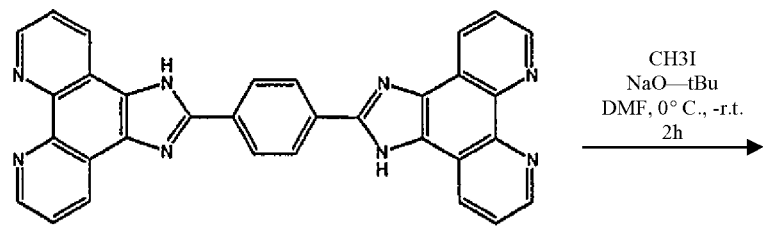

--

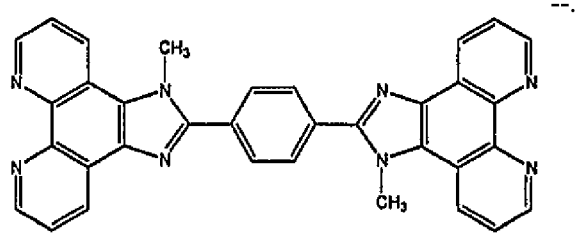

Compound D

--.

UNITED STATES PATENT AND TRADEMARK OFFICE
CERTIFICATE OF CORRECTION

PATENT NO. : 7,179,542 B2  Page 2 of 5
APPLICATION NO. : 10/441164
DATED : February 20, 2007
INVENTOR(S) : Jian Ping Chen et al.

It is certified that error appears in the above-identified patent and that said Letters Patent is hereby corrected as shown below:

COLUMN 11
      Line 8, "Compound 2" should read --Compound B--; and
      Line 21, "Compound 4" should read --Compound D--.

COLUMN 12
      LINES 58-65, " 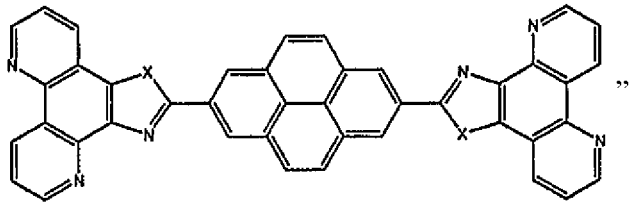 "

should read

-- 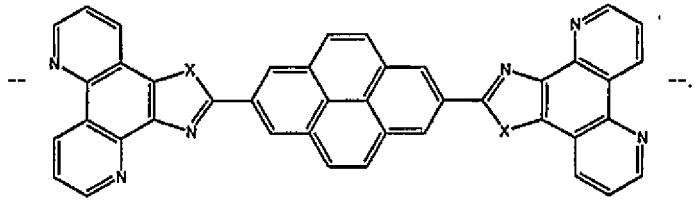 --.

COLUMN 15
      Line 32, "molecules" should read --molecule--; and

UNITED STATES PATENT AND TRADEMARK OFFICE
CERTIFICATE OF CORRECTION

PATENT NO. : 7,179,542 B2  
APPLICATION NO. : 10/441164  
DATED : February 20, 2007  
INVENTOR(S) : Jian Ping Chen et al.

Page 3 of 5

It is certified that error appears in the above-identified patent and that said Letters Patent is hereby corrected as shown below:

COLUMN 15 CONT'D

Lines 39-58, " 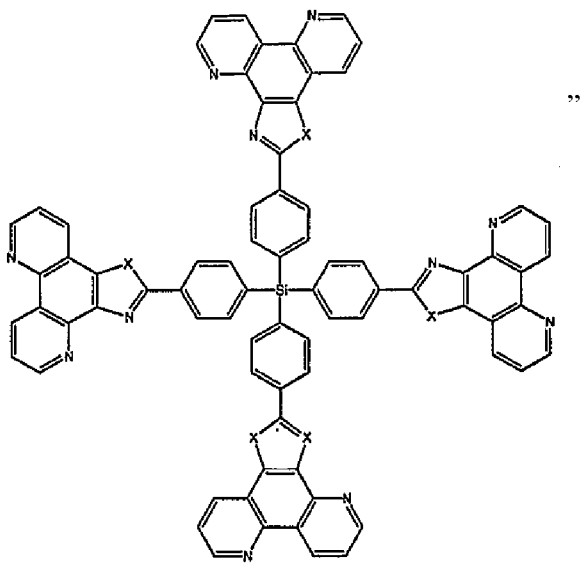 "

should read

-- 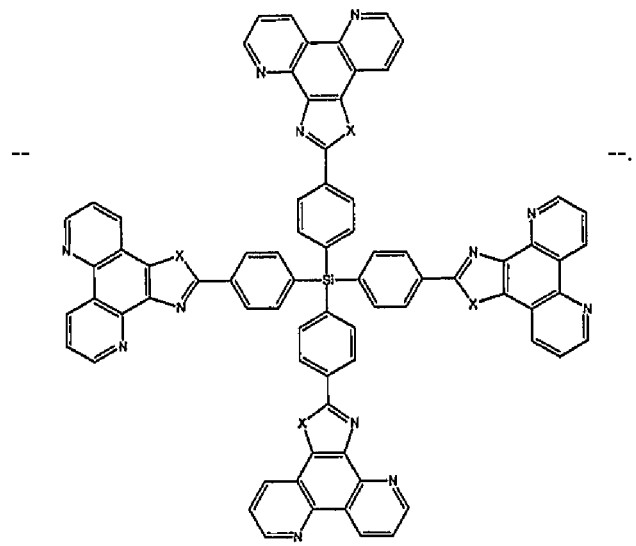 --.

UNITED STATES PATENT AND TRADEMARK OFFICE
CERTIFICATE OF CORRECTION

PATENT NO. : 7,179,542 B2 Page 4 of 5
APPLICATION NO. : 10/441164
DATED : February 20, 2007
INVENTOR(S) : Jian Ping Chen et al.

It is certified that error appears in the above-identified patent and that said Letters Patent is hereby corrected as shown below:

COLUMN 16

Lines 57-65, " 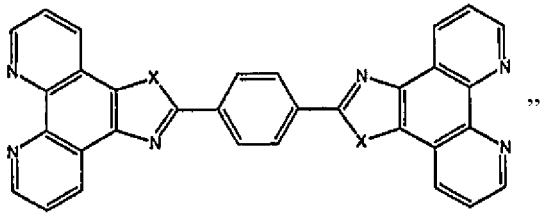 "

should read

-- 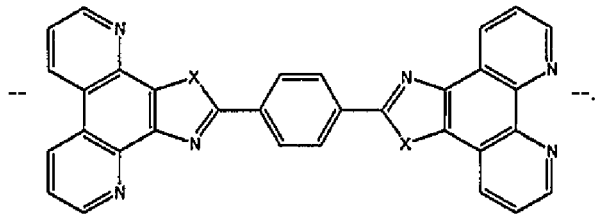 --.

COLUMN 17

Lines 8-18, " 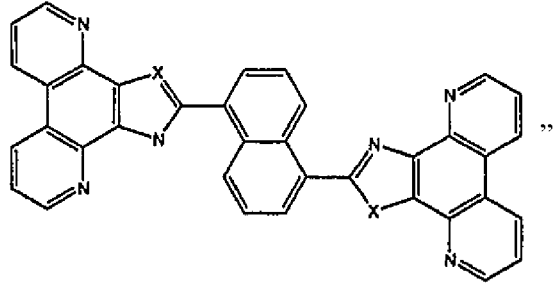 "

should read

-- 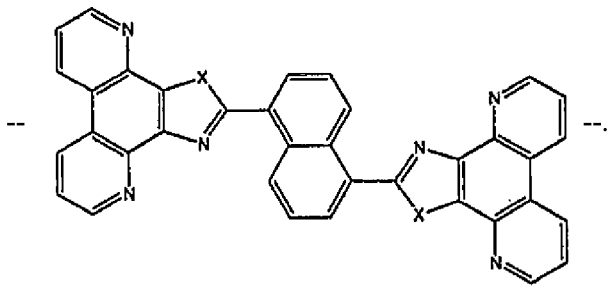 --.

UNITED STATES PATENT AND TRADEMARK OFFICE
CERTIFICATE OF CORRECTION

PATENT NO. : 7,179,542 B2 Page 5 of 5
APPLICATION NO. : 10/441164
DATED : February 20, 2007
INVENTOR(S) : Jian Ping Chen et al.

It is certified that error appears in the above-identified patent and that said Letters Patent is hereby corrected as shown below:

COLUMN 18

Lines 32-42, " 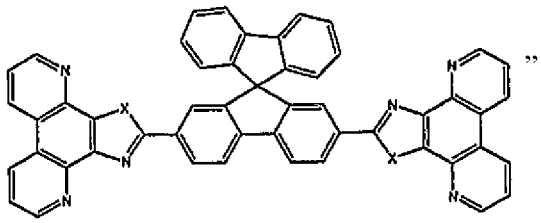 "

should read

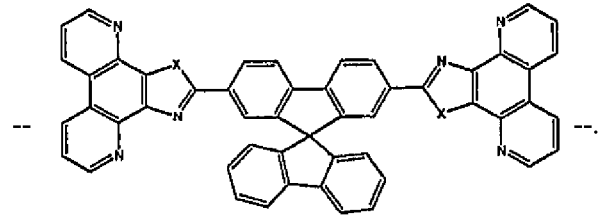

-- --.

Signed and Sealed this

Eighteenth Day of December, 2007

JON W. DUDAS
*Director of the United States Patent and Trademark Office*